United States Patent
Atkins et al.

(10) Patent No.: US 7,559,205 B2
(45) Date of Patent: Jul. 14, 2009

(54) CRYOGEN TANK FOR COOLING EQUIPMENT

(75) Inventors: Andrew Farquhar Atkins, Oxon (GB); Paul Beasley, Oxfordshire (GB); Andrew James Gray, Oxon (GB)

(73) Assignee: Siemens Magnet Technology Ltd., Witney (GB)

( * ) Notice: Subject to any disclaimer, the term of this patent is extended or adjusted under 35 U.S.C. 154(b) by 348 days.

(21) Appl. No.: 11/349,259

(22) Filed: Feb. 8, 2006

(65) Prior Publication Data

US 2006/0218942 A1 Oct. 5, 2006

(30) Foreign Application Priority Data

| Mar. 23, 2005 | (GB) | ................... 0505903.5 |
| Jul. 11, 2005 | (GB) | ................... 0514171.8 |

(51) Int. Cl.
H01F 6/00 (2006.01)
F25B 19/00 (2006.01)
(52) U.S. Cl. ........................ 62/51.1; 335/216
(58) Field of Classification Search .................. 62/51.1; 335/216
See application file for complete search history.

(56) References Cited

U.S. PATENT DOCUMENTS

| 3,302,415 | A | * | 2/1967 | Royet | .......................... 62/46.3 |
| 4,502,296 | A | | 3/1985 | Ogata et al. | |
| 6,119,465 | A | * | 9/2000 | Mullens et al. | ................. 62/60 |
| 6,864,770 | B2 | * | 3/2005 | Nemoto et al. | ............... 335/216 |
| 6,965,236 | B2 | * | 11/2005 | Havens | ......................... 324/319 |
| 6,970,062 | B2 | * | 11/2005 | Mulder | ........................ 335/300 |
| 6,998,947 | B2 | * | 2/2006 | Penn et al. | ................... 335/216 |
| 2005/0179512 | A1 | * | 8/2005 | Weyers et al. | ............... 335/300 |

FOREIGN PATENT DOCUMENTS

| GB | 2245350 A | 1/1992 |
| GB | 2274155 A | 7/1994 |

* cited by examiner

*Primary Examiner*—William C Doerrler
(74) *Attorney, Agent, or Firm*—Crowell & Moring LLP

(57) ABSTRACT

A cryogen tank in thermal and mechanical attachment with the equipment to be cooled. Direct thermal conduction between the cryogen and the equipment provides the required cooling. The tank is preferably arranged so as to lie within an existing profile of the cooled equipment, and to be relatively small as compared to known cryogen tanks.

30 Claims, 4 Drawing Sheets

Prior Art

CRYOGEN TANK FOR COOLING EQUIPMENT

The present invention relates to cryogen storage tanks within a cryostat such as is used for holding superconducting magnet coils at cryogenic temperatures. The present invention also relates to the reduction in size of such cryostats, the reduction in the consumption of liquid cryogen, and the reduction in cost of such cryostats.

Superconducting magnets are well known and are used for producing very high strength magnetic fields in applications such as magnetic resonance imaging (MRI). The superconducting magnet is typically made up of a number of coils of superconducting wire which, in use, must be held at cryogenic temperatures typically of the order of 4 K, the boiling point of liquid helium. Other so-called high temperature superconductors are available, and require cooling to temperatures such as the boiling point of neon (28 K), or of nitrogen (77 K), or of Hydrogen. The present invention is described with particular reference to liquid helium, but is equally applicable to arrangements employing other cryogens.

A typical arrangement has superconducting coils immersed in a bath of liquid cryogen, for example helium. The liquid cryogen is allowed to boil, and maintains the coils at a steady temperature of its boiling point, about 4 K in the case of helium. A recondensing refrigerator is provided, and provides cooling to the whole system, including by recondensing the boiled-off cryogen vapour back into a liquid. Thus, the overall consumption of liquid cryogen is reduced to a low value, since most if not all of the boiled off cryogen is recondensed back into liquid form within the cryogen vessel. Cryogens other than helium may of course be used, depending on the cryogenic temperature required.

FIG. 1 shows an axial cross-section of a solenoidal magnet system, comprising a former 10 with superconducting coils 12 mounted thereon. Such systems are typical for solenoidal superconducting magnets for MRI or nuclear magnetic resonance (NMR) imaging systems. The former 10 and coils 12 are housed within a cryogen vessel 14.

The cryogen vessel 14 is typically partially filled with a liquid cryogen, not shown in the drawing. The cryogen vessel itself is housed within an outer vacuum chamber 16, and the space between the cryogen vessel 14 and the outer vacuum chamber 16 is evacuated. A thermal shield 18 is typically also provided, in the evacuated space between the cryogen vessel and the outer vacuum container. This shield reduces the incidence of radiated heat from the outer vacuum chamber which may reach the cryogen vessel. A service neck 20 is typically included. In operation, this neck may house a recondensing refrigerator.

The cryogen vessel 14 is typically not completely filled with liquid cryogen. Rather, liquid cryogen is provided to a level of approximately 50% full. Considering the illustration in FIG. 1, the lower part of the former 10 and magnet coils 12 will be cooled by conduction through contact with the liquid cryogen. This will cause boil-off of some of the liquid cryogen to provide cryogen gas at approximately the boiling point of the cryogen. This cryogen gas will circulate about the upper part of the cryogen tank 14, and will cool the upper parts of the former 10 and the coils 12 by convection. There is likely to be a difference in the effectiveness of the cooling in these different ways. This may lead to a difference in temperature between different parts of the former and the coils. Certain embodiments of the present invention aim to avoid this difference.

A difficulty arises when the system is in transit, awaiting installation. Typically, the system is transported filled with liquid cryogen, but the recondensing refrigerator is unable to operate due to the absence of a suitable power source, or due to regulatory constraints. During the transit time, the cryogen is allowed to boil, keeping the coils at the required temperature. The cryogen thus acts as a thermal battery. Service neck 20 provides an escape path for boiled off cryogen to leave the cryogen vessel 14. The boiled off cryogen is allowed to vent to atmosphere. The system may be required to be capable of remaining in this boiling thermal battery state for a duration of up to about 30 days. When a cryogen such as helium is used, the cost of the cryogen lost by boiling may become significant.

It is required to keep the coils at a low temperature, since otherwise the commissioning of the system on installation becomes difficult and costly. If the system has heated up to ambient temperature, which will happen if the liquid cryogen boils dry, the system must be cooled and refilled with liquid cryogen before being commissioned. In some regions of the world, it is very difficult to obtain the large supplies of the liquid cryogen required for such an operation if not planned for in advance. Such a re-cooling and refilling is costly both in terms of the time a field engineer must spend on site installing the system, and the material cost of the cryogen used.

In magnet systems such as that illustrated in FIG. 1, the volume of the cryogen tank 14 is largely defined by the minimum allowable shipping time required. To allow a shipping time with the recondensing refrigerator inoperable of, say, thirty days, a large volume of liquid cryogen must be accommodated in the system to ensure that it does not boil dry during transit. The volume of this required cryogen tank 14 plays a large part in determining the final size of the whole system.

The present invention addresses some of the problems of the prior art, to provide a cryogenic tank in thermal contact with the equipment to be cooled. This contact cryogen tank may be employed to reduce the quantity of liquid cryogen required to maintain the required temperature of the equipment. The tank of the present invention may also serve to allow smaller housing for the equipment, while still allowing it to be maintained at the required operating temperature. The contact cryogen tank may be filled with a sacrificial cryogen to pre-cool the system to a first cryogenic temperature, before addition of the working cryogen.

Accordingly, the present invention provides apparatus as defined in the appended claims.

The above, and further, objects, characteristics and advantages of the present invention will become more apparent from consideration of the following description of certain embodiments thereof, given by way of examples only, with reference to the accompanying drawings, wherein FIG. 1 shows an axial cross-section of a typical solenoidal magnet structure housed within a cryostat;

Figure 1:
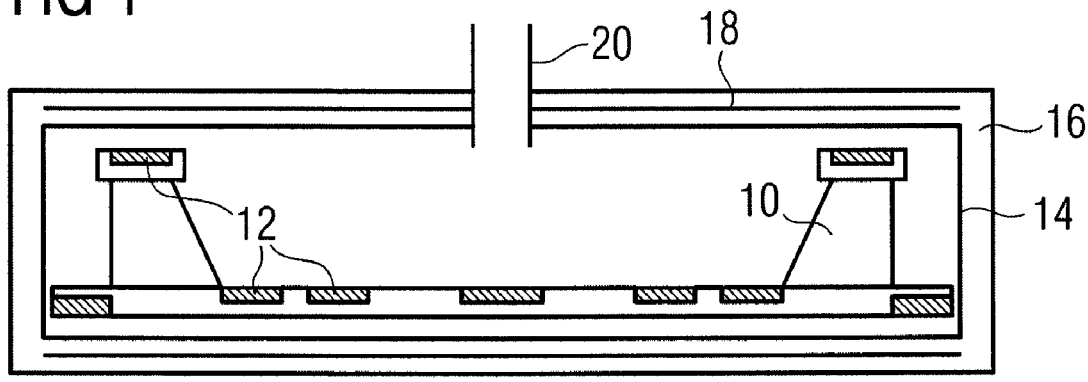
Figure 1:
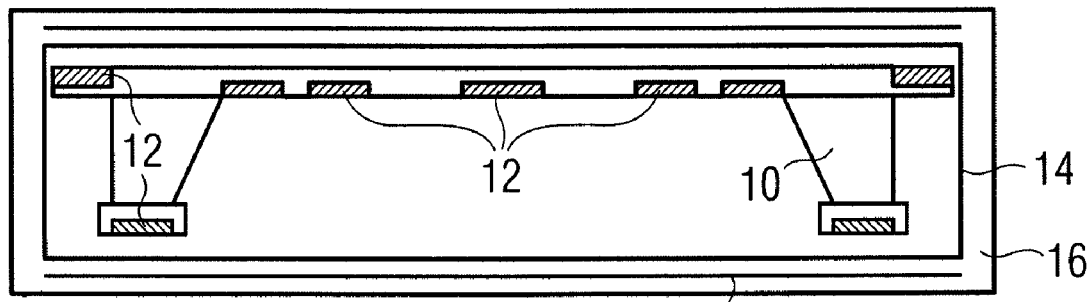

In its most basic form, the invention comprises a cryogen tank in thermal and mechanical attachment with the equipment to be cooled. Direct thermal conduction between the cryogen and the equipment provides the required cooling. The tank is preferably arranged so as to lie within an existing profile of the cooled equipment, and to be relatively small as compared to known cryogen tanks such as illustrated in FIG. 1.

Figure 2:
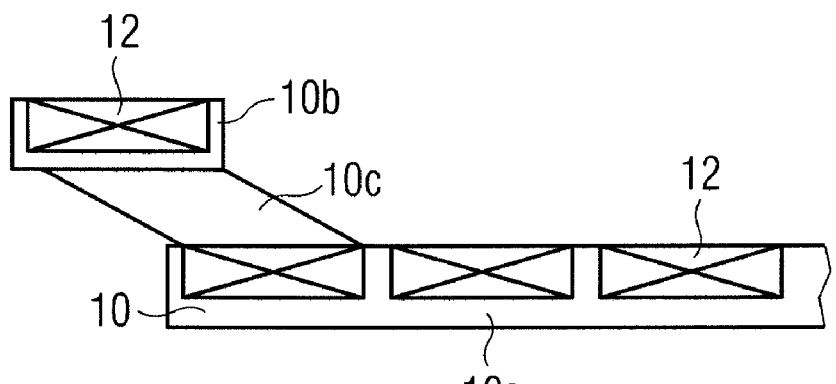
FIG. 2 shows an enlarged section of the cross-section of FIG. 1, showing the former and coils.

FIG. 2 shows an enlarged view of one end of the cross-section of the coils 12 and former 10. As shown, the former 10 consists of inner part 10a and outer part 10b. The inner and outer parts support respective coils 12. A number of webs 10c provide mechanical and thermal links between the inner and outer parts 10a 10b of the former. The webs 10c may, for example, comprise plates of aluminium, 13 mm thick. These webs serve to locate the outer part 10b of the former, and the coils 12 carried thereon, in the correct position relative to the coils of inner part 10a. As can be understood by consideration of FIGS. 1 and 2, the volume occupied by the webs represents a pair of approximately toroidal volumes, located towards the ends of the former 10, coaxial with the former 10 and coils 12.

According to preferred embodiments of the present invention, at least some of this volume is occupied by a contact cryogen tank. The contact cryogen tank may be substantially toroidal in shape, and may be placed coaxially with respect to the former.

In embodiments such as that illustrated, where a solenoidal magnet is the equipment to be cooled, it is preferred that identical contact cryogen tanks be symmetrically placed near the ends of the solenoid, to reduce any distortion of the magnetic field of the magnet.

Where the former comprises an inner part 10a of first diameter and at least one outer part 10b of a second diameter, greater than the first diameter, the contact cryogen tank may be substantially housed within a substantially toroidal volume, this volume being coaxial with the former, and having an outer diameter equal to the second diameter, and an inner diameter equal to the first diameter.

Figure 3:
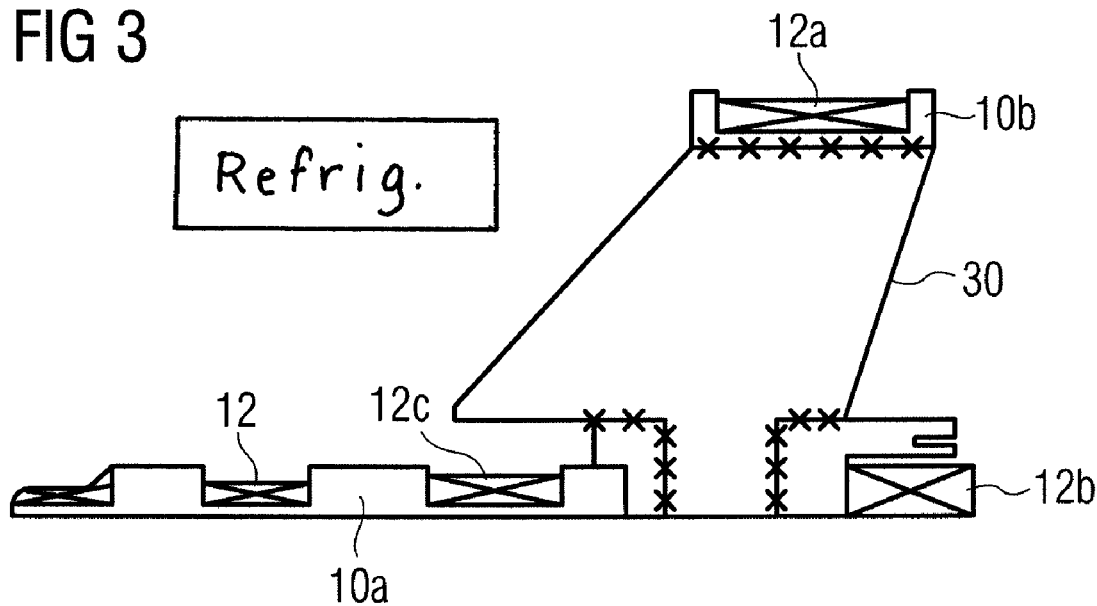
FIG. 3 shows a section of a former and coils modified according to an embodiment of the present invention.

Such an embodiment is illustrated in FIG. 3. Like FIG. 2, FIG. 3 represents an enlarged view of one end of the cross-section of the coils 12 and former 10, but modified according to the present invention. In this embodiment, the webs 10c are replaced by a substantially toroidal tank 30. The walls of the tank are rigid enough to provide the thermal conductivity and mechanical retention formerly provided by the webs 10c. The tank joins the former 10 at the interfaces marked with crosses in FIG. 3. By placing the contact cryogen tank in this location, good thermal contact to the former 10 and thence to coils 12 may be assured. The contact cryogen tank does not require any further structural support, and can be integrated into the structure of former 10, giving good circumferential contact to both inner and outer coils. In the embodiment illustrated in FIG. 3, the contact cryogen tank may also act as a thermal shunt around some of the coils 12. As shown in FIG. 3, the tank 30 is provided in close thermal contact with the outer shield coil 12a, drive coil 12b and the near field shaping coil 12c. There is a short thermal path through the material of the former 10 between the wall of tank 30 and each of the coils 12a, 12b, 12c. These are the coils which produce the most heat when in operation, and are the most likely to quench. It is therefore particularly advantageous in the embodiment of FIG. 3 that these coils are cooled most effectively.

The contact cryogen tank 30 may be filled with a working cryogen, a sacrificial cryogen or left unfilled, as required to achieve the respective advantages discussed below. The contact cryogen tank 30 may be formed from suitably shaped sheets of thermally conductive material, such as copper or aluminium, welded, braised or otherwise mechanically and thermally attached to the former 10. Alternatively, the tank 30 may be formed from an extrusion of an appropriate material. In this case, the outer part 10b of former 10 may be formed as part of the extrusion. In further variants, standard extrusions such as U- or H-section extrusions may be welded in place to provide the contact cryogen tank 30.

Figure 3A:
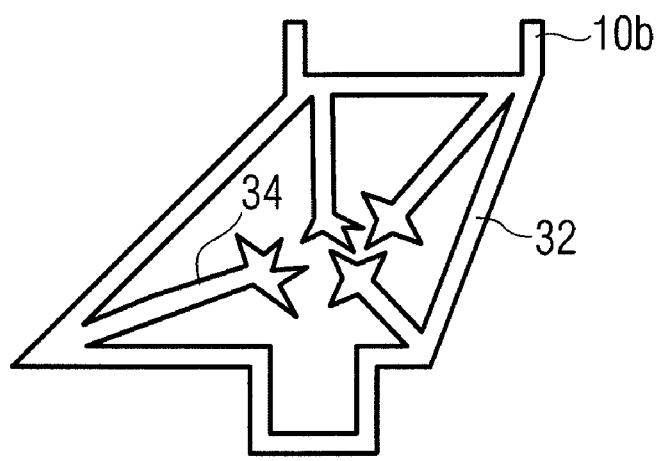
FIG. 3A shows a cross-section of a tank according to an embodiment of the invention.

Certain advantageous embodiments of the invention provide thermal conduction paths within the tank 30. FIG. 3A shows an example of an extruded tank 32. For example, the tank may be formed of an aluminium extrusion, bent to a circular shape to fit the former 10. In such case, the circular bent extrusion is preferably machined on its inner and outer radiused surfaces, to ensure good thermal contact with corresponding surfaces of the former 10 and the coil 12a. In some embodiments, the outer part 10b of the former is formed as an integral part of the same extrusion, or as a separate circular bent extrusion. In either case, it is preferred that the outer part 10b be machined on its outer radiused surface and its wall surfaces to ensure that the outer part 10b accurately matches the coil 12a. The tank 32 includes heat transfer formations 34 inside the tank. These formations are formed as a part of the extrusion. Preferably, such formations have a relatively large surface area and extend a significant distance toward the middle of the tank. Certain cryogens in their liquid or solid form have a relatively low thermal conductivity. In the absence of such heat transfer formations, the cryogen near the wall of the tank may melt, or boil, and escape from the tank 32 without effectively transferring heat to adjacent cryogen in the tank. Much more efficient cooling may be achieved by transferring heat through the whole volume of the cryogen, heating the cryogen more consistently. As an alternative to the extruded heat transfer formations shown in FIG. 3A, the tank 30 may be filled with a thermally conductive open celled material such as copper wool, to much the same effect.

Figure 4:
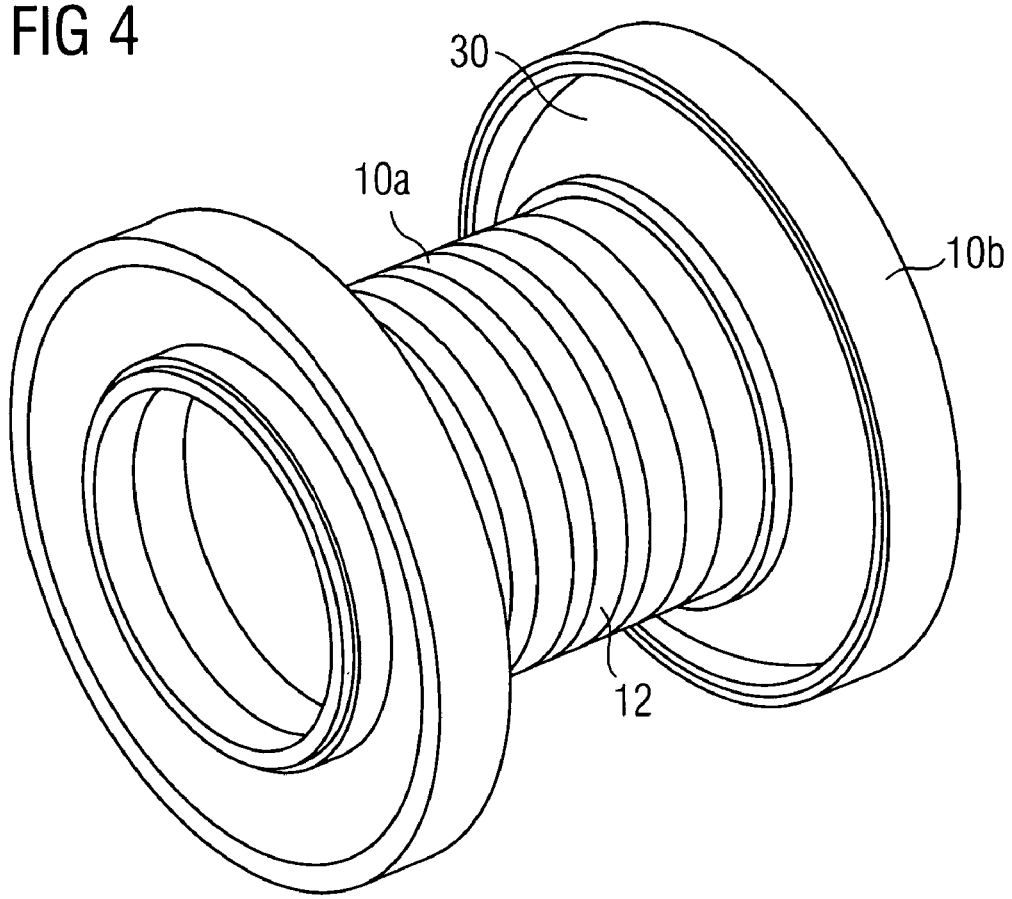
FIG. 4 shows a perspective view of a coil former and coils modified according the embodiment of FIG. 3 or FIG. 3A.

As best seen in FIG. 4, the contact cryogen tank 30 preferably does not protrude outside of the existing profile of the former 10.

Figure 5:
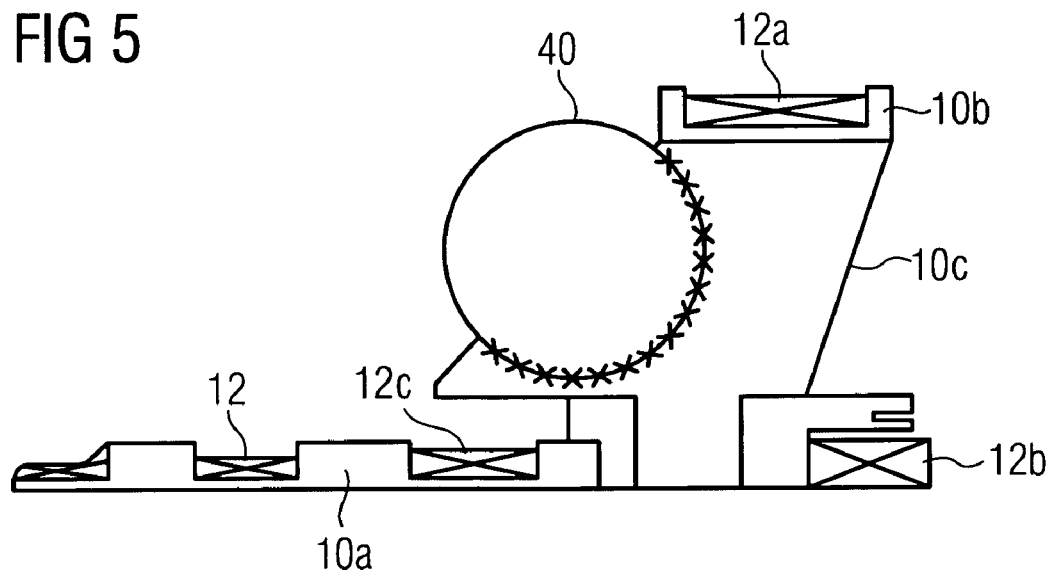
FIG. 5 shows a section of a former and coils modified according to another embodiment of the present invention.
Figure 6A:
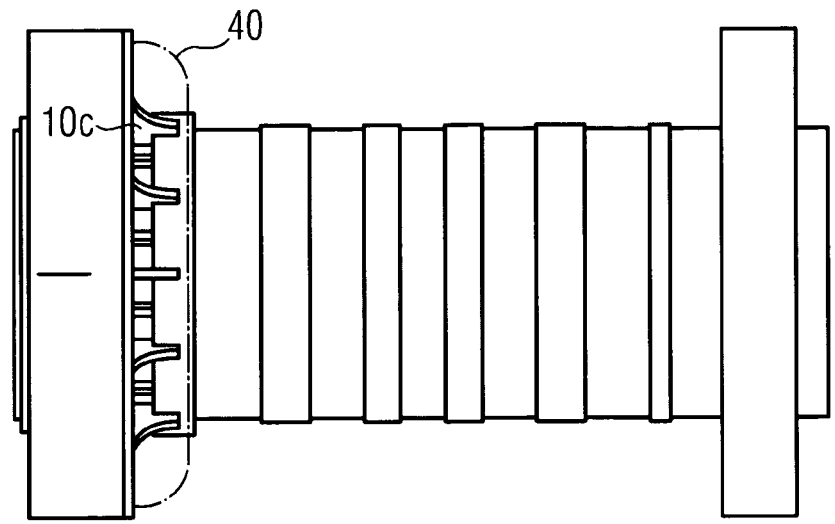
FIG. 6A shows a side view of a former and coils modified according to the embodiment of FIG. 5.
Figure 6B:
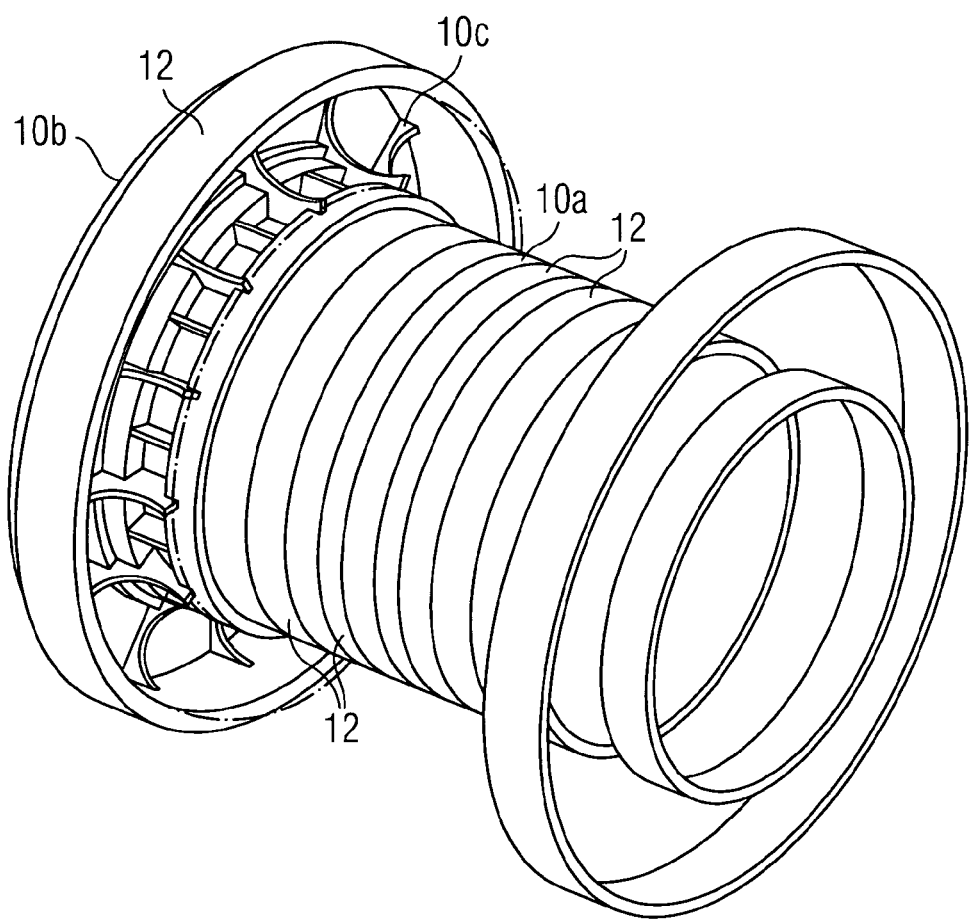
FIG. 6B shows a perspective view of the former and coils of FIG. 5. Part of the former is shown cut away for clarity.

Another embodiment is illustrated in FIG. 5. Like FIG. 3, FIG. 5 represents an enlarged view of one end of the cross-section of the coils 12 and former 10, but modified according to the present invention. In this embodiment, the webs 10c are shaped to accommodate at least part of the cross-section of a substantially toroidal contact cryogen tank 40. Substantially toroidal contact cryogen tank 40 may have a substantially circular cross-section. FIGS. 6A and 6B show profile and perspective views, respectively, of this embodiment of the invention, with the tank 40 shown in phantom to illustrate the shape and arrangement of the webs 10c. FIG. 6B shows a perspective view of this arrangement with the tank 40 in place.

The contact cryogen tank 40 joins the former 10 at the interfaces marked with crosses in FIG. 5. The contact cryogen tank 40 may be formed from rolled and welded shaped sheets of thermally conductive material, such as copper or aluminium. Alternatively, the contact cryogen tank 40 may be formed by extrusion of an appropriate material. The contact cryogen tank 40 is welded, braised or otherwise attached to the former 10 in a thermally conductive manner. The material chosen for the contact cryogen tank should preferably have a relatively low electrical conductivity, to avoid undesirable electrical eddy currents from being established in the material of the contact cryogen tank, since such currents could disturb the magnetic field produced by the magnet system. In this case, assembly of the former 10 will proceed as normal, with the shaped webs 10c as shown in FIG. 5. The tank may then be welded or otherwise thermally and mechanically attached to the webs.

As best seen in FIG. 6A, the contact cryogen tank 40 does not protrude outside of the existing profile of the former 10.

According to certain embodiments of the present invention, the contact cryogen tank of the present invention is provided within the cryogen tank 14 and in thermal and mechanical connection with the system to be cooled. When applied to the magnet system shown in FIG. 1, the contact cryogen tank may be placed in thermal connection with the former 10, and thermal connection to coils 12 may be achieved by conduction through the former.

According to certain embodiments of the present invention, the contact cryogen tank of the present invention may be used for precooling, using a sacrificial cryogen, in advance of cooling to working temperature by the working cryogen. For example, to cool a system from ambient temperature to a working cryogenic temperature, for example about 4 K, the following procedure may be used. A certain quantity of a sacrificial cryogen, for example liquid nitrogen, may be placed inside the contact cryogen tank. This will begin to boil, and in doing so will cool the associated equipment, for example a superconductive magnet mounted on a former, to the boiling point of sacrificial cryogen, in this example about 77 K. When the equipment has been cooled by the sacrificial cryogen, a quantity of working cryogen, for example liquid helium, is added to the working cryogen tank 14. This working cryogen boils, and in doing so, cools the equipment and any remaining sacrificial cryogen to the boiling point of the working cryogen, typically the working temperature, about 4 K in this example. Once the working cryogen has been added, a recondensing refrigerator 50 (shown schematically in Fig. 3) may be brought into operation, to reduce consumption of the working cryogen. In this way, effective precooling may be achieved, while the sacrificial cryogen may be kept from contaminating the working cryogen. Preferably, the quantity of sacrificial cryogen added in to the contact tank of the invention is carefully calculated, so that little if any sacrificial cryogen is left inside the tank once precool has been completed. This is perhaps particularly the case when a nitrogen sacrificial cryogen is employed. Due to the high specific heat capacity of nitrogen, and the presence of a solid-solid nitrogen phase transition, much heat must be drained from the nitrogen to cool it from its boiling point to the boiling point of helium, about 4 K. Any volume of inexpensive liquid nitrogen left in the contact tank after precool will require many volumes of costly liquid helium to cool it to operating temperature. It is therefore far preferable to use only just enough sacrificial cryogen to cool to the boiling point of the sacrificial cryogen. It many in fact be beneficial to use slightly less than the required amount of sacrificial cryogen, to leave a no sacrificial cryogen in the tank, and to perform a final stage of precool using the working cryogen.

In employing a sacrificial cryogen, it may be found beneficial to add high surface area thermal conductors within the contact tank, such as those illustrated in FIG. 3A or alternatives such as copper wool or any thermally conductive open celled structure.

In alternative embodiments, the contact cryogen tank of the present invention may be employed to hold working cryogen as conventionally stored in the cryogen vessel 14 of FIG. 1. This may be instead of, or in addition to, provision of working cryogen stored in the cryogen vessel 14.

In an alternative, or following use with a sacrificial cryogen as discussed above, the contact cryogen tank of the present invention may not in fact be filled. By leaving the tank of the invention empty, the volume of liquid cryogen required to fill the cryogen vessel 14 to a required depth is reduced. Alternatively, a same volume of liquid cryogen will immerse a greater proportion of the magnetic coils in the liquid, leading to a greater proportion of the magnet coils being cooled by contact with the liquid cryogen, in turn providing a more constant cooling of the magnet coils.

In yet further embodiments of the invention, the cryogen vessel such as illustrated at 14 in FIG. 1 may be dispensed with, leaving only the contact cryogen tank of the present invention to contain the working cryogen. By dispensing with the cryogen tank 14, a smaller overall system may be provided—or a larger diameter magnet may be provided in a given volume. A reduced volume of liquid cryogen would also be required, further reducing the cost of the system. For example, the or each contact cryogen vessel 30; 40 may have a volume of 300 liters, while the cryogen tank 14 of the conventional arrangement may have a volume of about 1500 liters. The outer vacuum chamber 16 would preferably still be provided, for thermal insulation. A recondensing refrigerator should preferably be provided for the or each contact cryogen vessel, to maintain the cryogen in liquid form. In such embodiments, consistent cooling is provided to all parts of the former, and all coils located on the former, by thermal conduction through the wall of the contact cryogen tank. This marks an improvement over the prior art immersion cryogen tank 14 as shown in FIG. 1, where part of the apparatus is cooled by conduction through physical contact with the cryogen, while another part of the apparatus is cooled by convection of boiled off cryogen gas.

The shape of the contact cryogen tank in the embodiments of FIGS. 3-6B is naturally capable of withstanding high pressure loads, such as may arise during a quench—that is, when a superconducting magnet coil suddenly becomes resistive, dissipating large quantities of heat and boiling off the working cryogen very rapidly. The substantially 20 toroidal contact cryogen tanks such as shown in FIGS. 3-6B provide mechanical stability to the former, and reduce the phenomenon known as petaling: the relative motion of the outer part 10b of former 10, or the deformation of the outer part 10b of former 10 at positions between the webs 10c.

An advantage of the present invention is that the cryogen tank 14 need not be provided. In certain embodiments of the invention, the cryogen tank 14 is no longer needed, as the cryogen tank of the present invention is used alone. The simple fact of not providing the cryogen tank allows the overall system to be made shorter and with an increased patient bore diameter. This aspect will be discussed more fully below. Further advantageous aspects of avoiding the need to provide a cryogen tank 14 include a saving in material cost, build time and system complexity. It is known to provide surface treatment to the cryogen tank to reduce the thermal emissivity of the material of the tank. Such treatment is also avoided. Known stainless steel cryogen tanks may include approximately 500 kg of stainless steel. A cryogen tank according to the present invention may include no more than 100 kg of stainless steel. The saving of 400 kg of mass is important in itself, but further advantageous effects arise by removing the need to cool this extra 400 kg of stainless steel. In order to cool the cryogen tank to operating temperature, to enable it to contain liquid cryogen, a significant volume of the liquid cryogen is boiled off. This is typically vented to atmosphere and lost. This represents a costly and wasteful use of liquid cryogen. By reducing the mass of the cryogen vessel by 80%, as becomes possible according to the present invention, a corresponding reduction in the amount of liquid cryogen consumed in this step is achieved.

Another advantage of the present invention is that the length of the final magnet system may be reduced, and the patient bore diameter may be increased, for a given size of magnet. Both of these effects are desired at least in order to reduce the stress felt by a patient and their feelings of claustrophobia at being placed in a long narrow bore. The shorter and wider the patient bore may be, the more relaxed the patient will be. This will lead to a higher probability of an efficient imaging process. A shorter and wider patient bore will also provide improved access for medical intervention to the patient during the imaging procedure. In the prior art, the cryogen tank 14 is typically produced from 5 mm thick stainless steel. The various stainless steel components are welded together around the magnet structure to produce the cryogen tank. In order to protect the magnet coils from any damage which might otherwise result from the heat or materials used in the welding process, a minimum gap of about 40 mm is left between the closest coil 12 and the inside of the cryogen tank 14. If, according to the present invention, the cryogen tank is no longer required, this gap and tank wall thickness need not be provided. The thermal shield 18 and outer vacuum chamber 16 may be made correspondingly shorter, and of larger diameter. Since this improvement in outer dimensions should be realised at each end of the magnet, an overall reduction in system length of about 90 mm, and a similar increase in bore diameter, may be achieved.

Another advantage of the present invention is that the volume of liquid cryogen required is significantly reduced. While a cryogen tank 14 of the prior art may require 1500 liters of liquid cryogen to cool the magnet by immersion, the tank of the present invention may typically require any about 100 liters of liquid cryogen. This represents a significant saving in material costs. In embodiments where the tank of the present invention is filled with a sacrificial cryogen, or is not filled, and is housed within a conventional cryogen tank, the cryogen tank of the invention displaces a corresponding quantity of working cryogen, saving a corresponding material cost.

While the invention has been described with reference to a limited number of specific embodiments, it will be clear to one skilled in the art that other modifications and variations of the present invention may be made within the scope of the invention as defined in the appended claims. For example, while the present invention has been described with particular reference to cooling of solenoidal superconducting magnet structures suitable for MRI apparatus, the present invention may be applied to any equipment which requires cooling to cryogenic temperatures. The present invention has been particularly described with helium as the working cryogen and optionally also nitrogen as the sacrificial cryogen. Other cryogens may of course be used. Any sacrificial cryogen chosen should have a high heat capacity, and preferably should also have a high latent heat capacity in its phase changes. The chosen sacrificial cryogen should not expand as it solidifies. If a sacrificial cryogen is chosen which expands on solidifying, then the tank containing it must either relax to accommodate the expanding contents, or must be strong enough to withstand the pressure put on it by the expanding cryogen. The form and placement of the contact cryogen tank of the present invention may be other than as described above, within the scope of the appended claims.

The invention claimed is:

1. A substantially cylindrical former for a solenoidal magnet, in combination with a cryogen tank for containing a cryogen for cooling the former, wherein:

the cryogen tank comprises a substantially toroidal or cylindrical enclosure that is enclosed by outer surfaces thereof and is coaxial with the former:

the former is situated outside of said enclosure:

an outer surface of the cryogen tank is in thermal contact with and mechanically attached to the former;

the former comprises an inner part having a first diameter and at least one outer part having a second diameter greater than the first diameter; and the cryogen tank is substantially housed within a substantially toroidal volume that is coaxial with the former, and has an outer diameter equal to the second diameter, and an inner diameter equal to the first diameter.

2. The combination according to claim 1, wherein:

the inner and outer parts of the former are mechanically linked by a plurality of webs that are shaped to accommodate at least part of the cross-section of the cryogen tank, and the outer surface of the cryogen tank is thermally linked and mechanically attached to the webs.

3. The combination according to claim 1, wherein inner and outer parts of the former are mechanically and thermally linked by the cryogen tank.

4. The combination according to claim 3, wherein the cryogen tank is located in close thermal contact with an outer shield coil, a drive coil and a field shaping coil.

5. The combination according to claim 1, further comprising a plurality of coils mounted on the former, said plurality of coils forming a solenoidal magnet.

6. The combination according to claim 1, wherein the cryogen tank has a substantially circular cross-section.

7. The combination according to claim 1, further comprising a recondensing refrigerator for maintaining a cryogen level within the cryogen tank.

8. The combination according to claim 1, further comprising cryogen tanks symmetrically placed in locations near the ends of the former.

9. The combination according to claim 1, wherein the cryogen tank contains heat transfer formations.

10. The combination according to claim 1, wherein the cryogen tank contains an open celled thermally conductive material.

11. The combination according to claim 1, wherein the or each cryogen tank is formed of suitably shaped sheets of thermally conductive material.

12. The combination according to claim 1, wherein the or each cryogen tank is formed of one or more suitably shaped extrusions.

13. The combination according to claim 10, wherein the outer part of the former is formed as part of an extrusion.

14. The combination according to claim 1, housed within an outer cryogen tank.

15. An MRI system comprising a solenoidal magnet in combination with a cryogen tank according to claim 1.

16. A method for cooling a solenoidal magnet, comprising the steps of:

providing a plurality of coils mounted on a substantially cylindrical former to form the solenoidal magnet, the former comprising an inner part having first diameter and at least one outer part having a second diameter greater than the first diameter;

providing a cryogen tank that comprises an enclosure that is enclosed by outer surfaces thereof, with said former being situated outside said enclosure; wherein, an outer surface of said enclosure is in thermal contact with and mechanical attachment to the former;

said cryogen tank is i) substantially toroidal or cylindrical in shape, ii) coaxial with the former, and iii) housed substantially within a substantially toroidal volume that is coaxial with the former;

said cryogen tank has an outer diameter equal to the second diameter, and an inner diameter equal to the first diameter; and the cryogen tank is filled with a cryogen, thereby cooling the solenoidal magnet by conduction of heat from the coils, through the material of the former and the outer surface of the tank, to the cryogen.

17. A method according to claim 16, wherein the cryogen tank is filled with a working cryogen to cool the solenoidal magnet to an operating temperature.

18. A method according to claim 16, wherein the cryogen tank is first filled with a quantity sacrificial cryogen, which completely boils away to cool the solenoidal magnet to a first temperature, higher than an operating temperature; and the cryogen tank is then filled with a working cryogen to cool the solenoidal magnet to an operating temperature.

19. A method according to claim 16, wherein the cryogen tank is filled with a sacrificial cryogen, thereby to cool the solenoidal magnet to a first temperature, higher than an operating temperature; and the solenoidal magnet is further cooled by immersion in a working cryogen to cool the solenoidal magnet to the operating temperature.

20. The method according to claim 19, wherein the cryogen tank is at least substantially empty of sacrificial cryogen when the solenoidal magnet is immersed in working cryogen.

21. The method according to claim 16, wherein:

the inner and outer parts of the former are mechanically linked by a number of webs;

said webs are shaped to accommodate at least part of the cross- section of the tank; and said cryogen tank is attached by its outer surface in thermal contact with and mechanical attachment to the webs.

22. The method according to claim 16, wherein the inner and outer parts of the former are mechanically and thermally linked by outer surfaces of the cryogen tank.

23. The method according to claim 16, wherein the cryogen tank is located in close thermal contact with an outer shield coil, a drive coil and a field shaping coil.

24. The method according to claim 16, further comprising the step of recondensing cryogen boiled off from the cryogen tank, thereby to maintain a cryogen level within the cryogen tank.

25. The method according to claim 16, wherein the cryogen tank is formed of suitably shaped sheets of thermally conductive material.

26. The method according to claim 16, wherein the cryogen tank is formed of one or more suitably shaped extrusions.

27. The method according to claim 26, wherein the outer part of the former is formed as part of an extrusion.

28. Apparatus for cooling coils of a solenoidal magnet, comprising:

a former on which said coils are wound, said former comprising an inner part having a first diameter, and an outer part that is coaxial with said first part and has a second diameter, greater than the first diameter;

a supporting structure connected between said inner part and said outer part for maintaining a fixed spatial relationship between said parts; and a contact cryogen tank comprising a separate enclosure which is enclosed by outer surfaces thereof, is in thermal contact with said former, and is mounted within a substantially toroidal volume between said first and second diameters.

29. The apparatus according to claim 28, wherein said contact cryogen tank is supported on and in thermal contact with said supporting structure.

30. The apparatus according to claim 28, wherein said contact cryogen tank forms at least a part of said supporting structure.

* * * * *